United States Patent [19]
Ohno

[11] Patent Number: 5,631,573
[45] Date of Patent: May 20, 1997

[54] PROBE-TYPE TEST HANDLER

[75] Inventor: Tosio Ohno, Kumamoto, Japan

[73] Assignee: Mitsubishi Denki Kabushiki Kaisha, Tokyo, Japan

[21] Appl. No.: 407,369

[22] Filed: Mar. 20, 1995

[30] Foreign Application Priority Data

Sep. 20, 1994 [JP] Japan .................................. 6-225032

[51] Int. Cl.$^6$ .............................. G01R 1/04; G01R 31/28
[52] U.S. Cl. .............................................. 324/754; 324/758
[58] Field of Search ...................................... 324/754, 758

[56] References Cited

U.S. PATENT DOCUMENTS 5,172,049  12/1992  Kiyokawa et al. ..................... 324/758

FOREIGN PATENT DOCUMENTS 61108983  12/1984  Japan .
63142826  12/1986  Japan .

Primary Examiner—Ernest F. Karlsen
Assistant Examiner—Barry C. Bowser
Attorney, Agent, or Firm—Leydig, Voit & Mayer

[57] ABSTRACT

A probe-type test handler includes a measurement module for performing electrical characteristic tests on an IC, a performance board electrically connected to the measurement module in an interchangeable manner that allows the type of the performance board to be selected according to the type of the IC to be measured, a probe card having a probe needle connected to the performance board, and a pressure mechanism that allows the tip of the linear portion of the probe needle to be pressed into contact with the lead projected out of the IC package near its IC package body. A test method using the test handler is also disclosed.

20 Claims, 9 Drawing Sheets

FIG. 13A
FIG. 13B
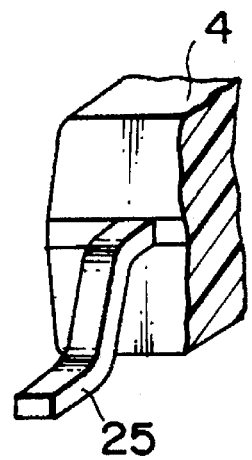
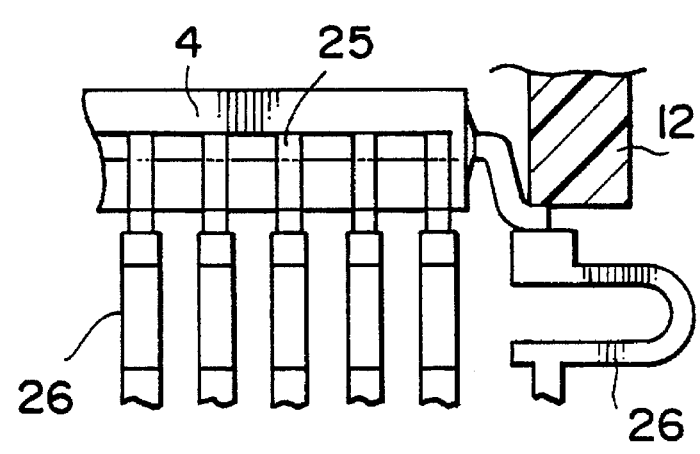
FIG. 13C
FIG. 13D
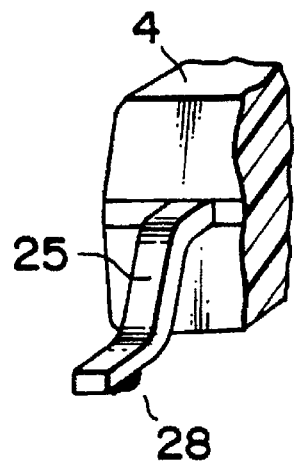
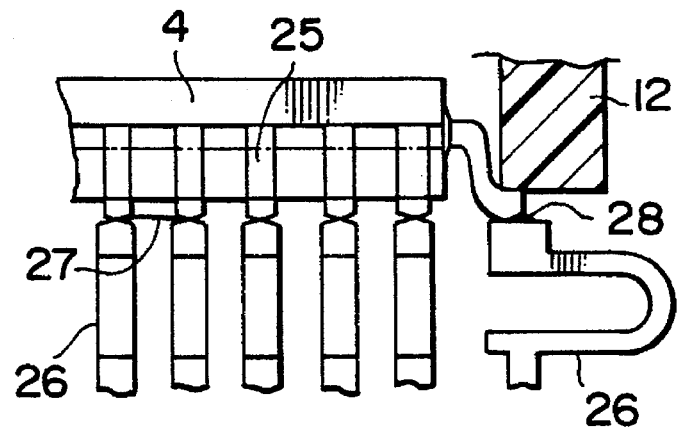

PROBE-TYPE TEST HANDLER

BACKGROUND OF THE INVENTION

1. Field of the Invention

The present invention relates to a probe-type test handler that is used in the final examination of semiconductor integrated circuits (ICs) in terms of electrical characteristics to accept or reject them and categorize them according to performance.

2. Description of the Related Art

A test handler is an apparatus which feeds electrical signals to respective leads of an IC to perform operational tests, performs the final examination to the IC in terms of electrical characteristics, and determines whether the IC is rejected or accepted, and categorizes the IC according to its performance.

FIG. 11A is a perspective view showing a handler which has been proposed in the past. FIG. 11B is a perspective view showing an IC to be measured. FIG. 12A is a perspective view showing an IC and its socket. FIG. 12B is a cross-sectional view showing the IC and its socket in place.

Shown in FIG. 11A are a loader (in-loader) 1, an inspection section 2 for measuring an IC that is brought in by the loader 1, an unloader (out-loader) 3 for delivering the IC measured at the inspection section 2. The loader 1, the inspection section 2 and the unloader 3 are constructed as follows.

The loader 1 comprises a device pallet 5 for mounting IC 4 thereon, a suction tool 6 for sucking an IC 4 to pick it from the device pallet 5, a loader plotter 7 for moving the suction tool 6 with its IC 4, a rotating table 8 for receiving the IC 4 carried by the loader plotter 7, a suction tool 9 for sucking the IC 4 to pick it from the rotating table 8, a loader plotter 10 for moving the IC 4, sucked by the suction tool 9, to the inspection section 2, and a suction tool 11 for sucking the IC 4 to pick it up on the inspection section 2.

The inspection section 2 comprises a hot plate 13 for receiving the IC 4 brought in from the loader 1 and turning the IC 4 thereon so that the IC 4 is heated to an inspection temperature during a single turn, a test socket 14 provided with contact bars for feeding electrical signals to the leads of the heated IC 4, an adapter socket 15 into which the test socket 14 is inserted for electrical connection, a performance board 16 selectively changed by IC type, and electrically connected to the adapter socket 15, and a measurement module 19 consisting of a test head 17 electrically connected to the performance board 16 and a tester main block 18 electrically connected to the test head 17.

The unloader 3 comprises a stage 20 onto which the IC 4 is temporarily placed after measurement, a suction tool 21 for sucking the IC 4 to pick it up from the stage 20, an unloader plotter 22 for moving the suction tool 21 with the IC 4 in both an X and Y directions, a device pallet 23 onto which an IC 4 determined to be non-defective is placed, and a defective component device pallet 24 onto which an IC 4 determined to be defective is placed.

The operation of the illustrated test handler thus constructed is now discussed.

The suction tool 6 sucks an IC 4 to pick it up from the device pallet 5, and then, the loader plotter 7 is set operative to move the suction tool 6 along with its IC 4 to the rotating table 8.

The rotating table 8 rotates, the loader plotter 10 moves the suction tool 9 over the IC 4 to pick it up, then moves the suction tool 9 along with the IC 4 over the hot plate 13, and then places the IC 4 onto the hot plate 13.

The hot plate 13 is allowed to turn by a single turn, during which the IC 4 is heated to the inspection temperature. The suction tool 11 picks up the heated IC 4. The loader plotter 10 is operated to allow the IC 4 to drop into the test socket 14, and a lead press 12 presses the leads 25 of the IC 4.

FIG. 12A is a perspective view showing the lead press 12, the IC 4, and the socket 14. FIG. 12B is a cross-sectional view showing the state in which the components of FIG. 12A are mounted in place. As shown, the leads 25 of the IC 4 are set onto the tips of the contact bars 26 disposed in the test socket 14, and then firmly pressed on the contact bars 26 by the lead press 12. Electrical signals are fed to the leads 25 of the IC 4 via the contact bars 26 to perform electrical-operation tests.

After the operation tests, the IC 4 is picked up by the suction tool 11, and moved to the stage 20 by the loader plotter 10. A non-defective IC conforming to a predetermined performance requirement is moved to the device pallet 23 by the suction tool 21 and the unloader plotter 22, and an IC falling within a different requirement or a defective IC is moved to the defective component device pallet 24.

In the test handler described above, the lead press 12 presses the tips of the leads 25 against the top of the contact bars 26. Solder of the leads 25 remains stuck to the contact bars 26, or solder sticking takes place.

In a perspective view in FIG. 13A, the tips of the leads 25 of the IC 4 are normal, and in a front view in FIG. 13B, the leads 25 are correctly seated on the contact bars 26 in the test handler. In contrast, as shown in FIG. 13D, solder is peeled off in a needle-like projection which is a so-called solder bridge 27 that forms a short-circuit between leads 25. Furthermore, as shown in FIG. 13C and FIG. 13D, solder deposits in a solder ball 28 which presents poor contact between a lead 25 and its respective contact bar 26. As a result, a good IC may be rejected as defective, and no appropriate inspection in terms of performance may be performed. This problem is even more serious when a multiple pin design with a pin separation of 0.3 mm to 0.5 mm between leads is implemented.

Furthermore, the IC 4 can be inclined with respect to the test socket 14 when both are engaged. This may cause the tip portion of the leads 25 to be bent. The lead press 12 may press the leads 25 onto the contact bars 26 with solder balls or needle-like projections between the leads 25 and the contact bars 26. This may also cause the tip portion of the leads 25 to be bent. Such lead deformation may be a cause for a rejection of IC.

The construction of the apparatus is complex. It comprises the suction tool 9 for picking up and moving an IC, the loader plotter 10, the lead press 12 for measurement, and many more elements.

With the number of leads increasing in multiple pin design, the spacing of the leads 25 is narrowed. Accurate alignment between the leads 25 and the respective contact bars 26 is difficult to achieve and electrical connection may thus suffer from poor contact.

SUMMARY OF THE INVENTION

In view of the foregoing problems, the present invention has been developed. It is an object of the present invention to provide a probe-type test handler and its test method, which prevent solder sticking and projections from occurring and are free from poor contact between the leads and the contact bars and shortcircuit between the leads.

It is another object of the present invention to provide a probe-type test handler and its test method, in which lead deformation is prevented.

It is yet another object of the present invention to provide a probe-type test handler and its test method, in which both the pick-up and transfer operations of an IC are straightforward and the construction of the measurement mechanism is simplified in order to achieve measurement efficiency.

It is yet another object of the present invention to provide a probe-type test handler and its test method, in which an increased level of multiple pin design with narrowed lead spacing is accommodated.

A probe-type test handler according to a first aspect of the present invention comprises a measurement module accommodating an electrical circuit for the measurement of electrical characteristics of an IC, a performance board electrically connected to the electrical circuit in an interchangeable manner that allows the type of the performance board to be selected according to the type of the IC to be measured, a probe card having a probe needle that is formed of a linear portion, a bent portion and a beam portion that is continued to the bent portion, and a pressure mechanism that allows the tip of the linear portion of the probe needle to be pressed into contact with the lead projected out of the IC package near its IC package body.

According to a second aspect of the present invention, the pressure mechanism comprises holder mechanism for holding the IC, and an XYZ stage for moving the pressure mechanism in X, Y, and Z directions.

According to a third aspect of the present invention, the pressure mechanism comprises rotation control means for rotating the holder mechanism around each of the three axes of X, Y, and Z in a controlled manner.

According to a fourth aspect of the present invention, the rotation control means comprises rotation control module that performs rotation control in response to signals from position sensors that sense the positions of the probe needle and the lead.

According to a fifth aspect of the present invention, the linear portion is 2 mm to 3 mm long, the angle of the bent portion is 92° to 95°, and the length of the beam portion is 5.5 mm to 8 mm long.

According to a sixth aspect of the present invention, separation mechanism is provided to detach the probe needle from the lead by applying pressure to the probe needle after the measurement with the probe needle kept pressed into contact with the lead is completed.

According to a seventh aspect of the present invention, groove is formed on a pressure portion of the separation mechanism which applies pressure to the probe needle, and the probe needle is received by the groove.

According to a eighth aspect of the present invention, a small-magnitude vibrator is provided to allow the separation mechanism to vibrate in a small magnitude.

According to a ninth aspect of the present invention the separation mechanism comprises a miniature motor for driving the separation mechanism and a lead screw.

According to a tenth aspect of the present invention single performance board is provided with a plurality of probe cards and with the same number of pressure mechanisms as the probe cards.

A method of testing an IC according to eleventh aspect of the present invention comprises the step of pressing the tip of a linear portion of a probe needle of a probe card on a performance board, the probe card is provided with the probe needle that is formed of the linear portion, a bent portion and a beam portion that is continues from the bent portion by allowing a pressure mechanism to came into contact with the load projected out of the package near its IC package body, and the step of feeding an electrical signal to an lead of the IC, the electrical signal being supplied from a measurement module accommodating an electrical circuit for the measurement of an electrical characteristics of the IC, and via the performance board electrically connected to the measurement module in an interchangeable manner that allows the type of the performance board to be selected according to the type of the IC to be measured.

According to a twelfth aspect of the present invention, the pressure mechanism comprises a holder mechanism for holding the IC, and the pressure mechanism is moved with an XYZ stage which is movable in X, Y, and Z directions.

According to a thirteenth aspect of the present invention, the pressure mechanism comprises rotation control means and the holder mechanism is rotated around each of the three axes of X, Y, and Z in a controlled manner.

According to a fourteenth aspect of the present invention, the rotation control means is controlled in response to signals from position sensors that sense the positions of the probe needle and the lead.

According to a fifteenth aspect of the present invention, the linear portion is 2 mm to 3 mm long, the angle of the bent portion is 92° to 95°, and the length of the beam portion is 5.5 mm to 8 mm long.

According to a sixteenth aspect of the present invention, a separation mechanism is provided to detach the probe needle from the lead by applying pressure to the probe needle after a measurement is completed.

According to a seventeenth aspect of the present invention, a groove is formed on a pressure portion of the separation mechanism which applies pressure to the probe needle, and the probe needle is received by the groove.

According to an eighteenth aspect of the present invention, a small-magnitude vibrator vibrates the separation mechanism in a small magnitude.

According to a nineteenth aspect of the present invention, the separation mechanism is driven by a miniature motor and a lead screw.

According to a twentieth aspect of the present invention, a single performance board is provided with a plurality of probe cards and with the same number of pressure mechanisms as the probe cards and a plurality of ICs are simultaneously measured.

According to a twenty-first aspect of the present invention, an IC is provided with a number of solder-layer coated leads projected out of a side of the package of the IC, extended linearly in parallel with the plane of the top surface of the IC, and then bent downward, and each of said leads has a dent, which is formed by a contact or the like, on the solder-layer coating of its linearly extended portion on its bottom side.

According to a twenty-second aspect of the present invention, the surface is formed by pressing the tip of the linear portion of the probe needle into contact with the lead.

According to a twenty-third aspect of the present invention, the surface of the dent has a trace from which an oxide layer of solder is removed.

According to the first aspect and the eleventh aspect of the present invention, the probe card is used to allow the tip of the linear portion of the probe needle to be pressed into contact with the lead near its portion in the vicinity of the IC package edge where mechanical strength of the lead is higher. The production of solder sticking and solder balls is restricted, and thus a poor contact between the probe needle and the lead and a shortcircuit between leads are prevented. The lead is free from deformation, and defects attributed to a deformed lead are thus prevented.

According to the second aspect and the twelfth aspect of the present invention, a series of operations including steps of moving the IC, pressing the probe needle into contact with the lead of the IC, and moving the IC again, are performed in a continuous manner by the pressure mechanism comprising the XYZ stage and the holder mechanism. Such an arrangement not only shortens the operation time required, but also achieves a simplified construction of the apparatus.

According to the third aspect and the thirteenth aspect of the present invention, the pressure mechanism is provided with the rotation control means so that the holder mechanism is rotated around each of the three axes of X, Y, and Z. This arrangement allows the probe needle to be pressed into contact with the lead in an assured manner and offers the capability to accommodate a narrower lead spacing requirement in multiple pin design.

According to the fourth aspect and the fourteenth aspect of the present invention, the rotation control means comprises the rotation control module that controls the rotation of the holder means in response to the signals from the position sensors that sense the positions of the probe needle and the lead. Therefore, a contact between the lead and the probe needle is established in an assured manner.

According to the fifth aspect and the fifteenth aspect of the present invention, the linear portion of the probe needle is 2 mm to 3 mm long, the angle of its bent portion is 92° to 95°, and the length of its beam portion is 5.5 mm to 8 mm long. Such an arrangement achieves an excellent contact state with solder sticking substantially restricted.

According to the sixth aspect and the sixteenth aspect of the present invention, a separation mechanism is provided to detach the probe needle from the lead after a measurement. The production of solder projections is substantially controlled.

According to the seventh aspect and the seventeenth aspect of the present invention, a groove is formed on the separation mechanism and the probe needle is received by the groove. This arrangement prevents the probe needle from slipping toward neighboring leads.

According to the eighth aspect and the eighteenth aspect of the present invention, the small-magnitude vibrator means is provided to allow the separation mechanism to vibrate in a small magnitude. When the probe needle is put into contact with the lead of the IC, such vibration motion destroys an oxide layer formed on the lead solder coating on the bottom face of the lead and assures electrical contact between the probe needle and the lead.

According to the ninth aspect and the nineteenth aspect of the present invention, the separation mechanism comprises a miniature motor for driving the separation mechanism and a lead screw. Therefore, the probe needle is detached from the lead in an accurate manner.

According to the tenth aspect and the twentieth aspect of the present invention, a single performance board is provided with a plurality of probe cards and with the same number of pressure mechanisms as the probe cards. Such an arrangement allows a plurality of ICs to be simultaneously measured, and expands production capacity.

According to the twenty-first aspect through the twenty-third aspect of the present invention, a judgment of whether or not each IC has been tested is easily made by looking into the bottom side of the IC. Since the dot mark on the lead remains invisible when the IC is mounted onto a printed circuit board or the like, aesthetics of the IC is not deteriorated.

BRIEF DESCRIPTION OF THE DRAWINGS

FIG. 13A through 13D are explanatory views illustrating how poor contacts take place in the test handler of FIG. 11A.

DETAILED DESCRIPTION OF THE PREFERRED EMBODIMENTS

Embodiment 1

Figure 1A:
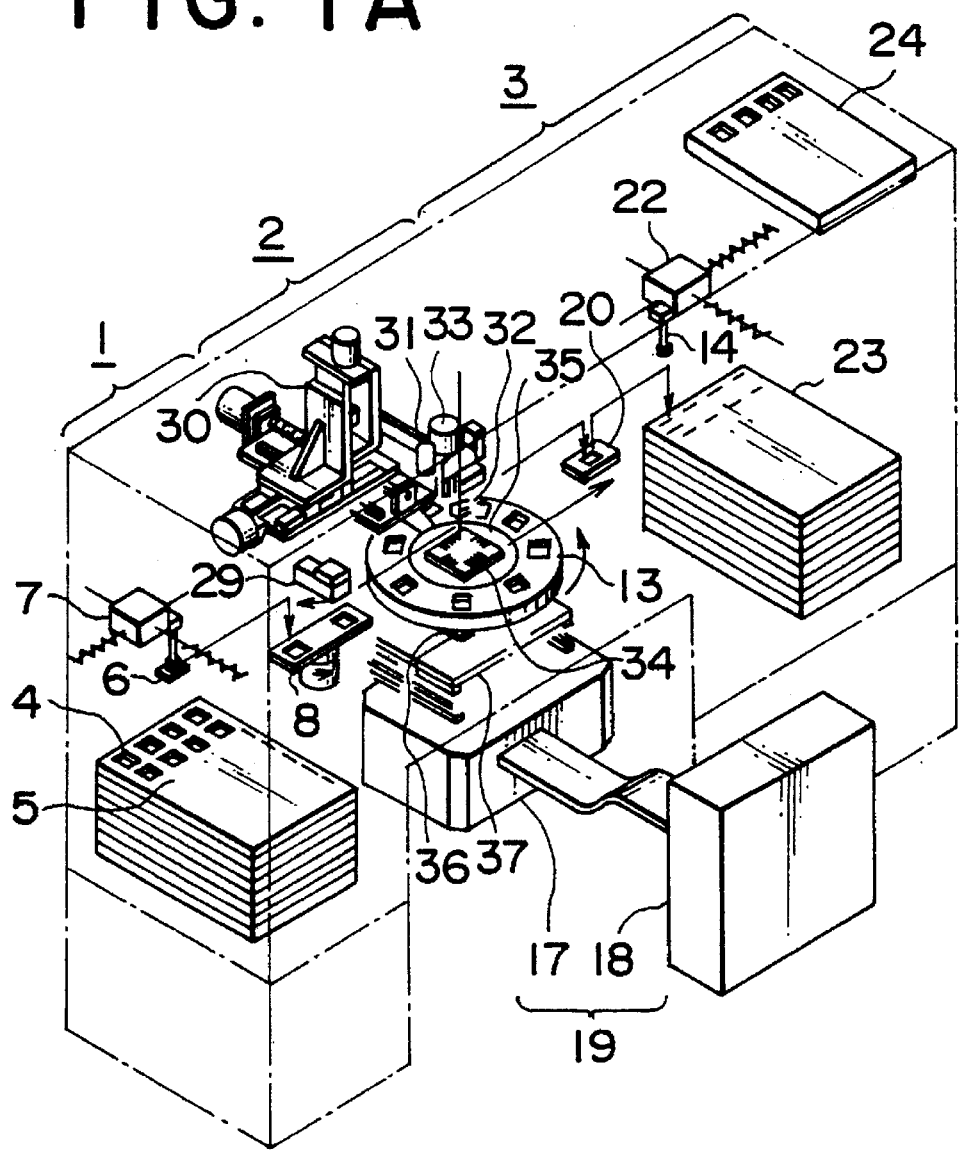
FIG. 1A generally shows the probe-type test handler according to the present invention.
Figure 1B:
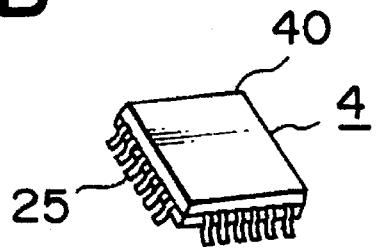
FIG. 1B is a perspective view showing an IC according to the present invention.

FIG. 1A is a perspective view showing generally the probe-type test handler of an embodiment of the present invention. FIG. 1B is a perspective view showing an IC to be measured.

Shown in FIGS. 1A and 1B are a loader 1, an inspection section 2 for measuring an IC that is brought in by the loader 1, an unloader 3 for delivering the IC measured at the inspection section 2. The loader 1, the inspection section 2 and the unloader 3 are constructed as follows.

The loader 1 comprises a device pallet 5 for mounting ICs 4 thereon, a suction tool 6 for sucking an IC 4 to pick it from the device pallet 5, a loader plotter 7 for moving the suction tool 6 with its IC 4, and a rotating table 8 which receives the IC 4 carried by the loader plotter 7 and then turns by 180°.

The inspection section 2 comprises an XYZ stage 30 for picking up the IC 4 from the rotating table 8, moving it to the inspection section 2, and then delivering the IC 4 to the unloader 3 when a measurement is complete, a hot plate 13 for holding and heating the IC 4 to an inspection temperature during its single turn, a pressure mechanism 33 for applying pressure to the IC 4 and having a holder mechanism 32 for holding the IC 4, a probe card 35 having a probe needle 34 that supplies an electrical signal to a lead 25 when, with the IC 4 pressed, the probe needle 34 is pressed into contact with the lead 25 of the IC 4 near its package 40, a performance board 37 electrically connected to the probe card 35 via an extension board 36, in an interchangeable manner that allows the type of the performance board to be selected according to the type of the IC 4 to be measured, a measurement module 19 including a test head 17 electrically connected to the performance board 37 and a tester main block 18 electrically connected to the test head 17, a position sensor 29 such as a CCD camera for sensing the position of the lead 25, and a position sensor 31 such as a CCD camera for sensing the position of the probe needle 34.

The unloader 3 comprises a stage 20 onto which the IC 4 is temporarily placed after a measurement, a suction tool 21 for sucking the IC 4 to pick it up from the stage 20, an unloader plotter 22 for moving the suction tool 21 with the IC 4 in both an X and Y directions, a device pallet 23 onto which an IC 4 determined to be non-defective is placed, and a defective component device pallet 24 onto which an IC 4 determined to be defective is placed.

Figure 2:
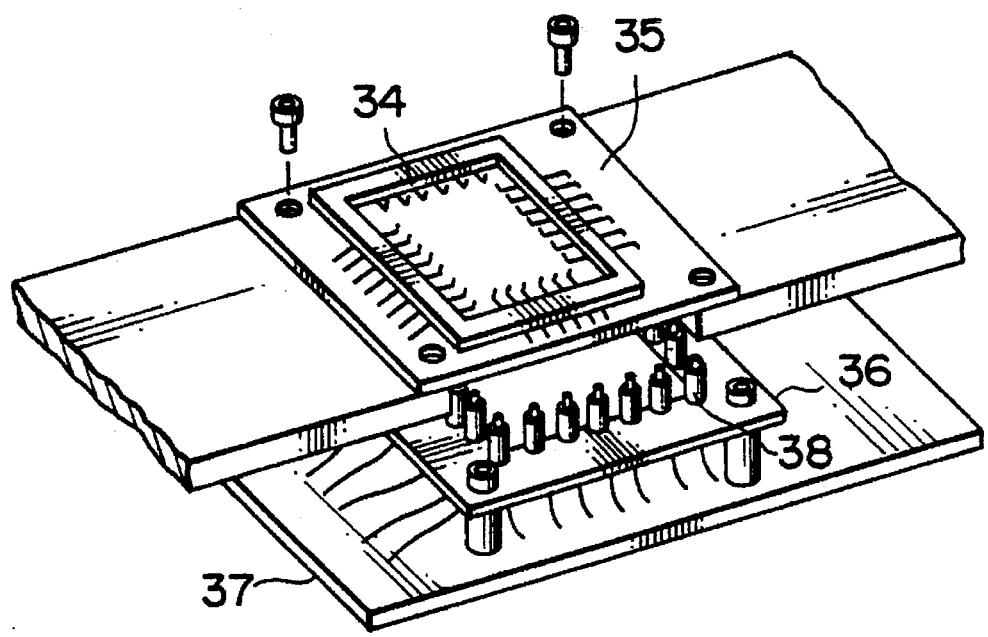
FIG. 2 is a perspective view showing the arrangement of the probe card and the performance board according to the present invention.

FIG. 2 shows the state in which the probe card 35, the extension board 36 and the performance board 37 are electrically connected. As shown, the conductor pins 38 disposed on the extension board 36 are inserted through through-holes 39 formed on the probe card 35 at the ends of the probe needles 34 in a manner that the ends of the conductor pins 38 are electrically connected to the probe needles 34. The other ends of the conductor pins 38 are connected to the circuit on the performance board 37 in a manner that they are firmly attached. The probe card 35 and the performance board 37 may be selectively changed in type according to the type of the IC 4 to be measured.

The operation of this embodiment of the probe-type test handler is as follows.

The suction tool 6 sucks an IC 4 to pick it up from the device pallet 5, and then, the loader plotter 7 is operated to move the suction tool 6 along with its IC 4 to the rotating table 8.

The rotating table 8 rotates by 180°, the XYZ stage 30 is driven to move the pressure mechanism 33 over the IC 4, and the holder mechanism 32 holds and picks up the IC 4. The XYZ stage 30 is again driven to move the IC 4 above the hot plate 13 and to place the IC 4 onto the hot plate 13.

The hot plate 13 is allowed to turn by a single turn, during which the IC 4 is heated to the inspection temperature. The pressure mechanism 33 is driven to allow the holder mechanism 32 to hold and pick up the heated IC 4. The XYZ stage 30 is driven to move the IC 4 above the probe card 35. The pressure mechanism 33 is operated to cause the leads 25 to be pressed into contact with the tips of the probe needles 34. The electrical signal is supplied from the measurement module 19 via the probe needles 34 to the leads 25 to perform operational tests on the IC 4.

Figure 3:
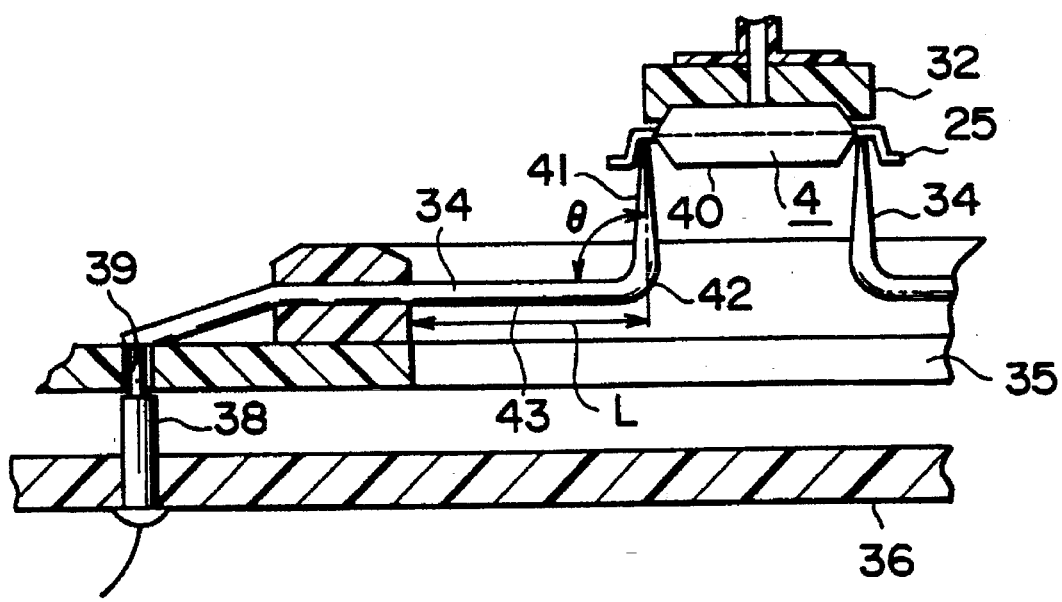
FIG. 3 is a cross-sectional view showing the construction of a probe needle according to the present invention and the contact state in which the probe needle remains pressed into contact with the lead of the IC.

FIG. 3 is a cross-sectional view showing the configuration of the probe needles 34 of the probe card 34 and the contact state of the probe needles 34 with the lead 25. As shown, the probe needle 34 is formed of a linear portion 41, a bent portion 42 that continues to the linear portion 41, and a beam portion 43 that continues to the bent portion 42. The tip of the linear portion 41 is designed to be pressed, from below, into contact with the lead 24 in the vicinity of the IC package 40.

To keep a good contact between the probe needles 34 and the leads 25 and avoid solder sticking, the length of the linear portion 41 of the probe needles 34 is preferably 2 mm to 3 mm long, the angle of the bent portion 42 is preferably 92° to 95°, and the length L of the beam portion is preferably 5.5 mm to 8 mm long.

After the operation test, the pressure mechanism 33 is operated to pick up the IC 4. The XYZ stage 30 is driven to place the IC 4 on the stage 20. A non-defective IC conforming to a predetermined performance requirement is moved to the device pallet 23 by the suction tool 14 and the unloader plotter 22, and an IC falling within a different requirement or a defective IC is moved to the defective component device pallet 24.

According to Embodiment 1, the probe card 35 is used to allow the tip of the linear portion 41 of the probe needles 34 to be pressed into contact with the leads 25 in the vicinity of the IC package edge where mechanical strength of the lead is higher. The production of solder sticking and solder balls is restricted, and thus poor contact between the probe needle and the lead and a shortcircuit between leads 25 are prevented. The leads are free from deformation, and defects attributed to a deformed leads are thus prevented.

Furthermore, the linear portion 41 of the probe needle 34 is 2 mm to 3 mm long, the angle of its bent portion is 92° to 95°, and the length L of its beam portion is 5.5 mm to 8 mm long. Such an arrangement achieves an excellent contact state with solder sticking substantially restricted.

Furthermore, a series of operations including steps of moving the IC 4 from the rotating table 8 of the loader 1 to the inspection section 2, pressing the probe needles 34 into contact with the leads 24 of the IC 4, and moving the IC 4 to the unloader 3, are performed in a continuous manner by the pressure mechanism 33 and the XYZ stage 30. Such an arrangement not only shortens the operating time required, but also achieves a simplified construction of the apparatus.

A judgment of whether or not each IC has been tested is easily made by looking into the bottom side of the IC. Since the dot mark on the lead remains invisible when the IC is mounted onto a printed circuit board or the like, aesthetics of the IC are not deteriorated.

Embodiment 2

Figure 4:
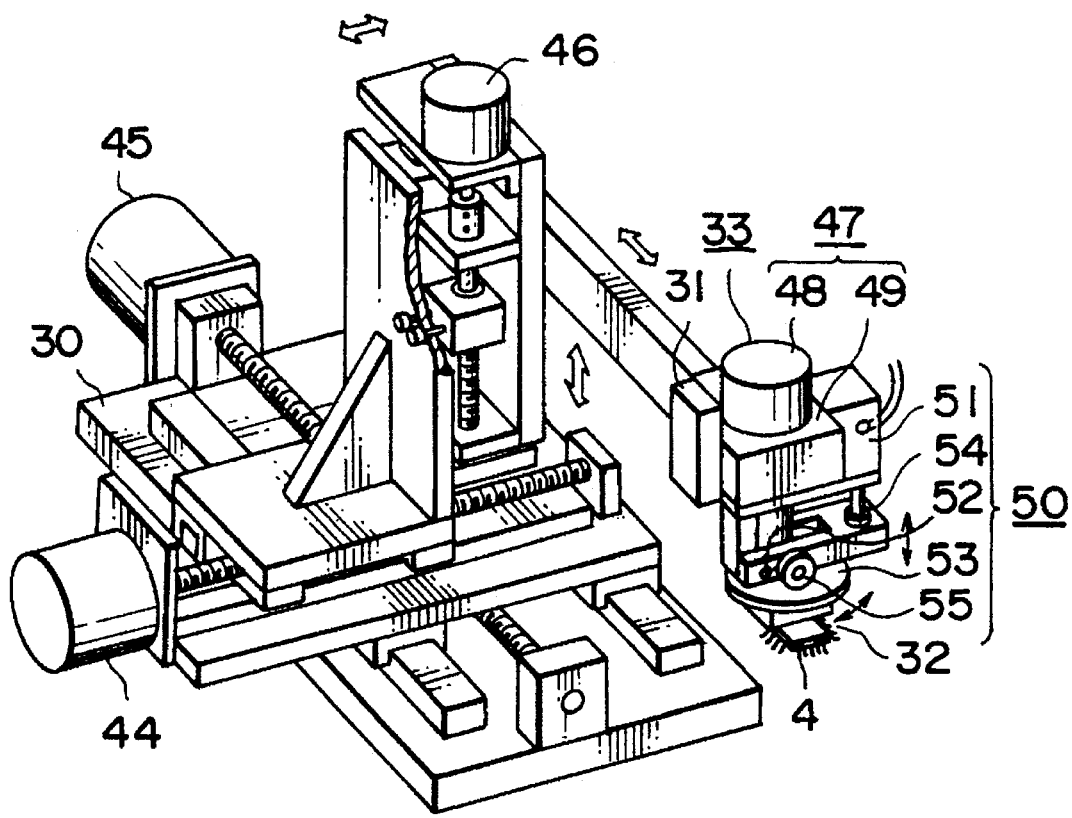
FIG. 4 is a perspective view showing another embodiment of the present invention.

FIG. 4 is a perspective view showing another embodiment of the present invention. This embodiment can be employed in the embodiment of FIG. 1A. Shown in FIG. 4 are an XYZ stage 30, a motor 44 for driving the XYZ stage 30 in the X direction, a motor 45 for driving the XYZ stage 30 in the Y direction, and a motor 46 for driving the XYZ stage 30 in the Z direction. The pressure mechanism 33 is moved in any of the X, Y, and Z directions in integral motion with the XYZ stage 30.

The pressure mechanism 33 has rotation control means 47 such as an angle adjusting motor. The rotation control means 47 causes the holder mechanism 32 to be rotated around each of the three axes of X, Y and Z by means of a motor 48 and a gear head 49.

The pressure mechanism 33 comprises a position sensor 31 such as a CCD camera for sensing the position of the probe needle 34. The rotation control means 47 comprises the rotation control module that performs the rotation of the holder mechanism 32 in response to the signals from the position sensor 31 and from the position sensor 29 such as the CCD camera for sensing the position of the lead 25.

Figure 5:
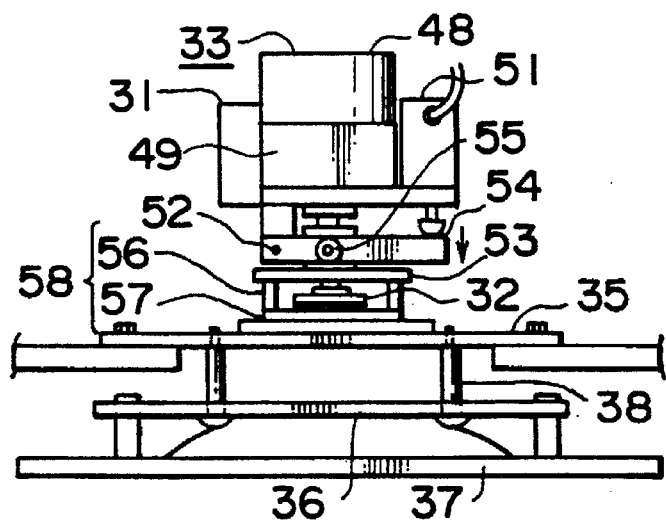
FIG. 5 is a front view showing the construction of the separation mechanism according to the present invention.
Figure 6:
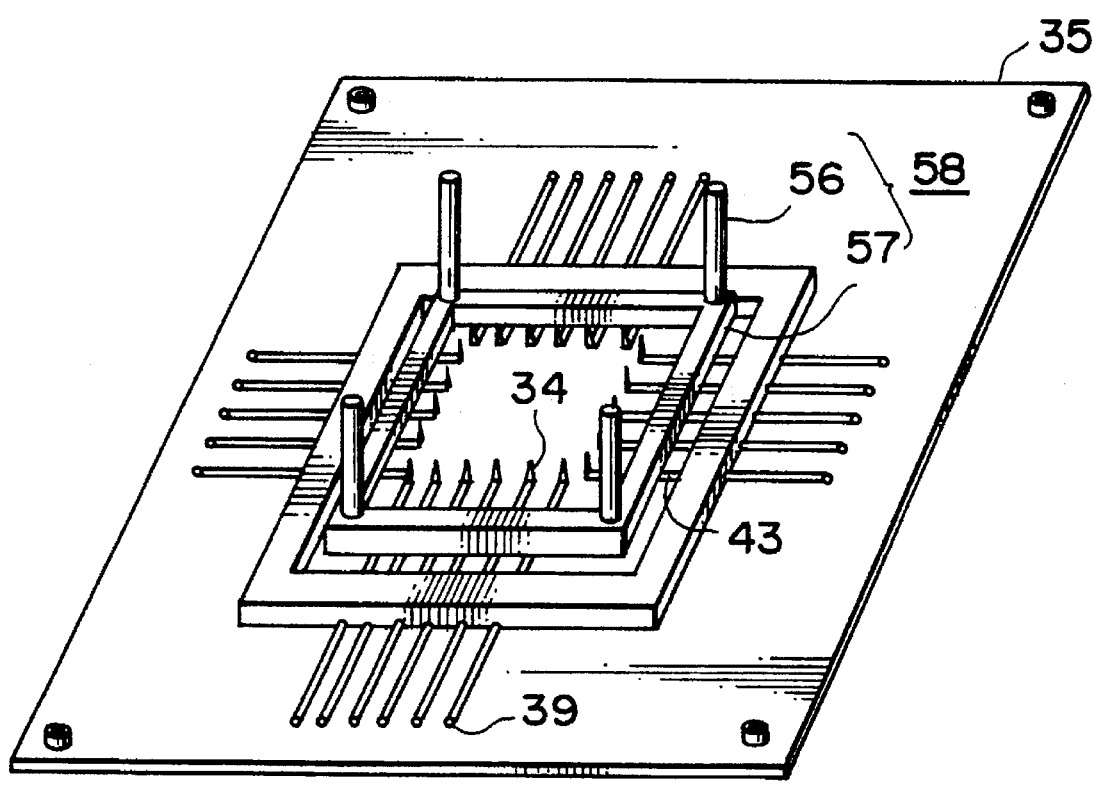
FIG. 6 is a perspective view showing the detachment tool according to the present invention.

The pressure mechanism 33 comprises a separation mechanism 50. The separation mechanism 50 comprises a cylinder 51, a pusher 53, and an arm 54 that pivots around a pin 52 to press the pusher 53 downward in cooperation with the downward motion of the cylinder 51. As shown in the front view in FIG. 5, the separation mechanism 50 further comprises a detachment tool 58 consisting of columns 56 and an insulating frame 57. An earring 55 serves to smooth pivotal movement of the arm 54. As shown in the cross-sectional view in FIG. 7, compression springs 59 are disposed between the pusher 53 and the holder mechanism 32. When the cylinder 51 is raised, the pusher 53 is also raised. As shown in the perspective view in FIG. 6, the columns 56 and the insulating frame 57 are mounted on the beam portions of the probe needles.

Figure 7:
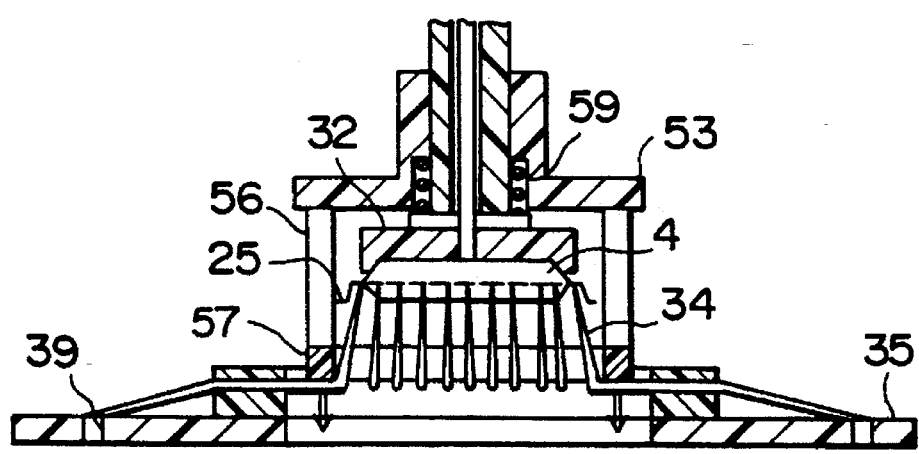
FIG. 7 is a cross-sectional view showing the detachment tool according to the present invention.

When the measurement is complete, the detachment tool 58 is lowered downward to detach the probe needles 34 from the leads 25 as shown in FIG. 7. The IC 4 along with the holder mechanism 32 is then raised.

FIGS. 8A through 8H illustrate the operation of the separation mechanism 50. In the case where no separation mechanism is used, as shown in FIG. 8A through 8D, a probe needle 34 is pressed into contact with a lead 25 (see FIG. 8A). When the probe needle 34 is further pressed, its tip slips (see FIG. 8B) and then halts at the maximum pressure point where measurements may be performed (see FIG. 8C). When the IC is then raised, the tip of the probe needle 34 scratches the surface of the lead 25 while the probe needle 34 recover its original position (see FIG. 8D). In the course of this process, sharp solder projections may be created.

Figure 8A:
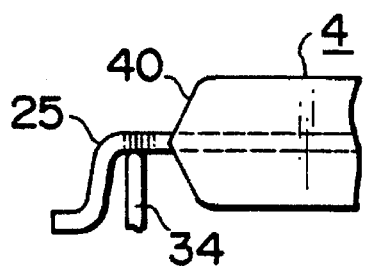
FIG. 8A through 8H are front views showing the operation of the separation mechanism according to the present invention.
Figure 8E:
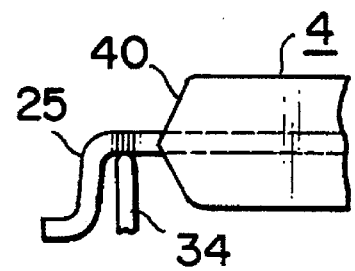
Figure 8B:
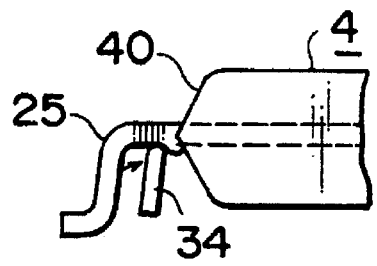
Figure 8F:
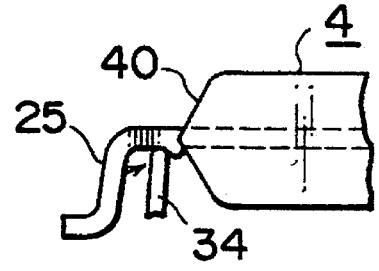
Figure 8C:
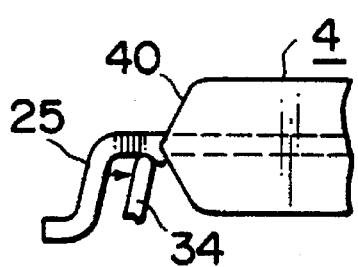
Figure 8G:
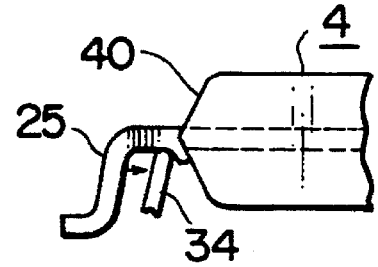
Figure 8D:
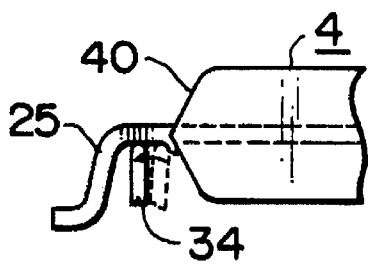
Figure 8H:
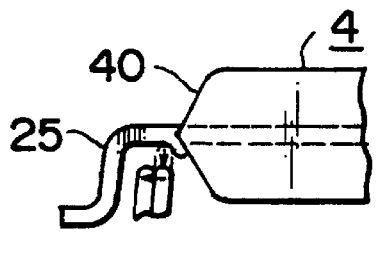

On the other hand, when the separation mechanism 50 is employed, as shown in FIG. 8E through 8H, after the measurement is complete (see FIG. 8E through 8G), the probe needle 34 is first lowered by the separation mechanism 50, and then the IC 4 is raised (see FIG. 8H). The probe needle 34 recover its original position without scratching the surface of the lead 25, and no solder projections thus take place.

Figure 9:
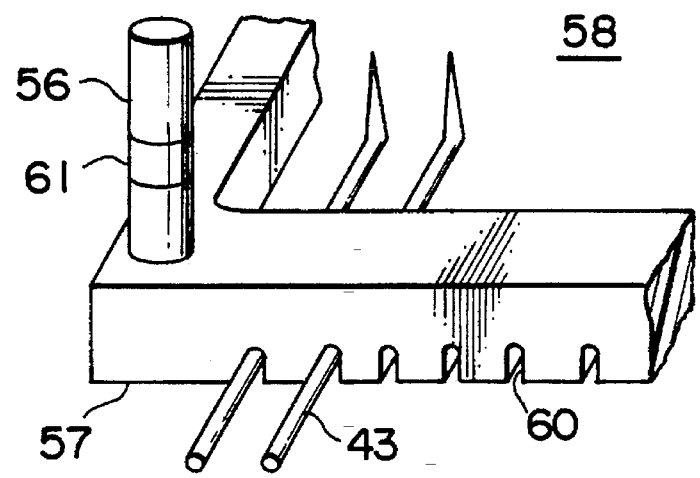
FIG. 9 is a partial perspective view showing the detachment tool according to the present invention.

FIG. 9 is a partial view of the detachment tool 58. As shown, the insulating frame 57 is provided with grooves 60, which receive the beam portions 43 of the probe needles 34. The columns 56 may have a small-magnitude vibrator mechanism 61 such as a piezoelectric element. It is important that the small-magnitude vibrator mechanism 61 vibrates the separation mechanism 50 in a small magnitude. Therefore, the vibrator mechanism 61 may be disposed in other positions, such as on the pusher 53 or the insulating frame 57. The small-magnitude vibrator mechanism 61 is not limited to the piezoelectric element. A vibrator of electromagnetic type may be perfectly acceptable as the vibrator mechanism 61.

According to Embodiment 2, the pressure mechanism 33 is provided with the rotation control means 47 so that the holder mechanism 32 is rotated around each of the three axes of X, Y, and Z. This arrangement allows the probe needle 34 to be pressed into contact with the lead 25 in an assured manner and offers the capability to accommodate a narrower lead spacing requirement in multiple pin design.

The rotation control means 47 comprises the rotation control module that controls the rotation of the holder mechanism 32 in response to the signal from the position sensor 31 such as a CCD that senses the position of the probe needle 34 and the signal from the position sensor 29 such as a CCD that sense the position of the lead 25. Therefore, contact between the lead 25 and the probe needle 34 is established in an assured manner.

The separation mechanism 50 is provided to detach the probe needle 34 from the lead 25 after each measurement, and thereafter the IC 4 along with the holder mechanism 32 are raised. The production of solder projections is thus substantially controlled.

The groove 60 is formed on the insulating frame 57 of the detachment tool 58 in the separation mechanism 50 and the beam portion 43 of the probe needle 34 is received by the groove 60. This arrangement prevents the probe needle 34 from slipping toward neighboring leads 25 when the probe needle 34 comes into contact with the lead 25.

The small-magnitude vibrator means 61 is disposed in each column 56 of the detachment tool 58. When the probe needle 34 is put into contact with the lead 25 of the IC 4, such vibration motion destroys an oxide layer formed on the lead solder coating on the bottom face of the lead 25 and assures electrical contact between the probe needle 34 and the lead 25.

Furthermore, in Embodiment 2, the separation mechanism 50 may be constructed of a miniature motor and a lead screw, instead of the cylinder 51. In such a arrangement, the probe needle 34 can be detached from the lead 25 in an accurate manner.

Figure 10:
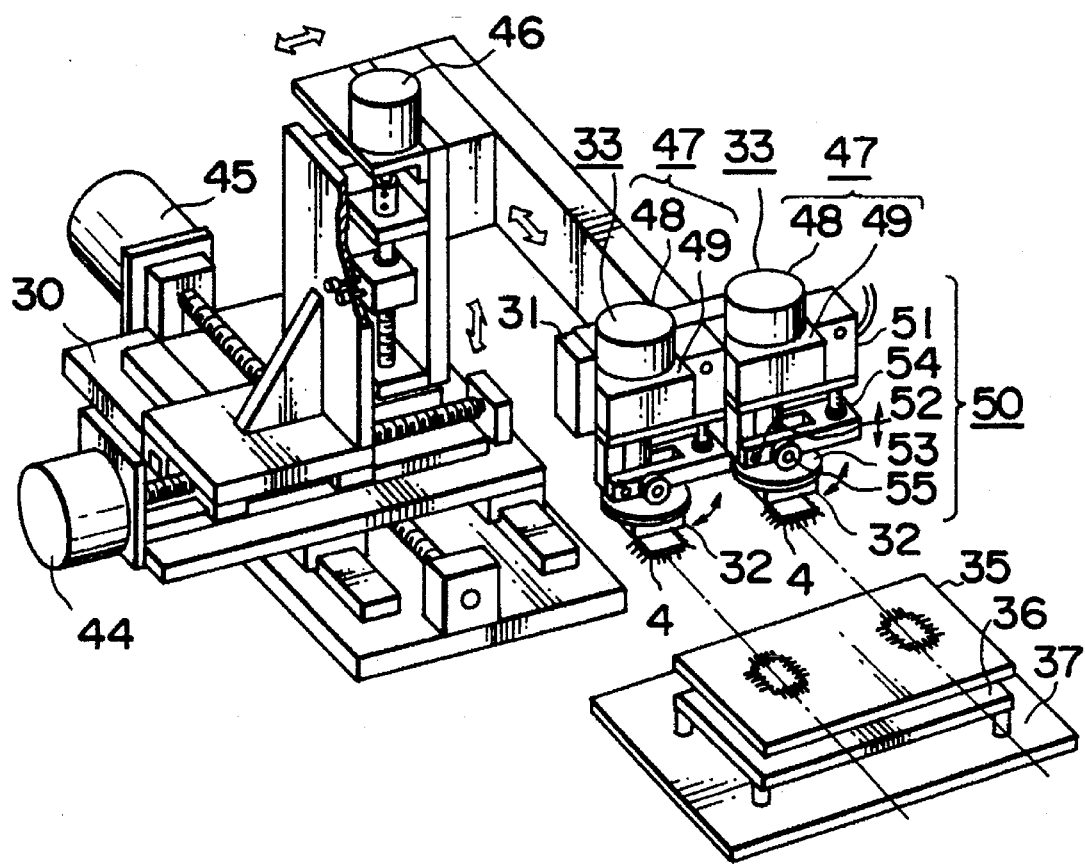
FIG. 10 is a perspective view showing another embodiment of the present invention.
Figure 11A:
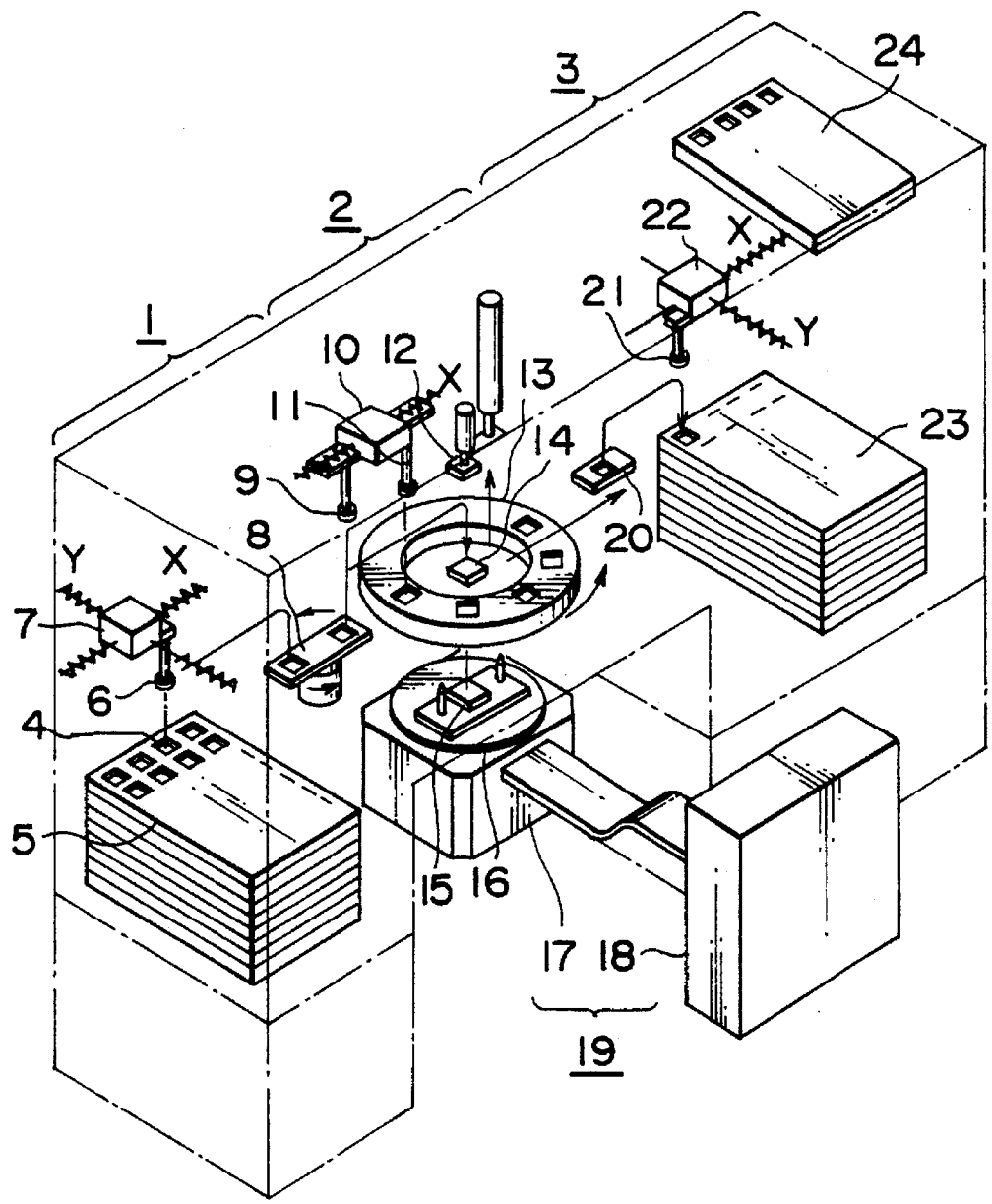
FIG. 11A is a perspective view showing a test handler which has been proposed in the past.
Figure 11B:
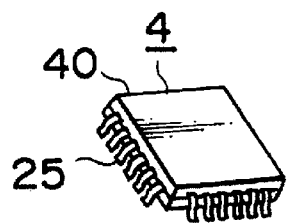
FIG. 11B is a perspective view showing an IC to be measured.
Figure 12A:
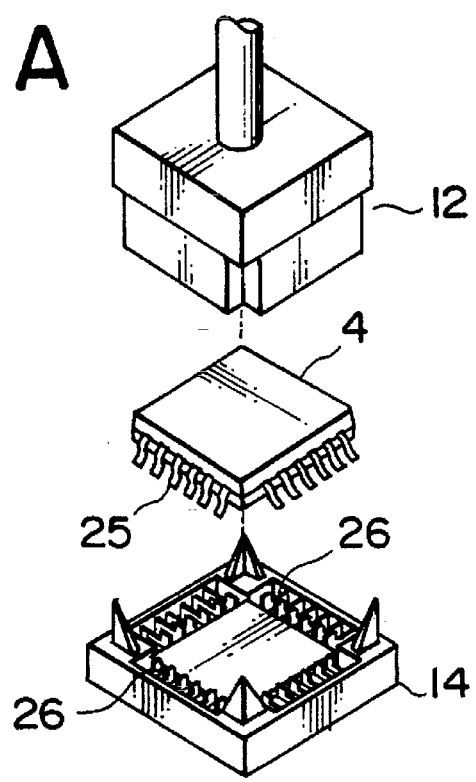
FIG. 12A and 12B are a perspective view and cross-sectional view, respectively, showing the construction of the contact bar of the test handler of FIG. 11A.
Figure 12B:
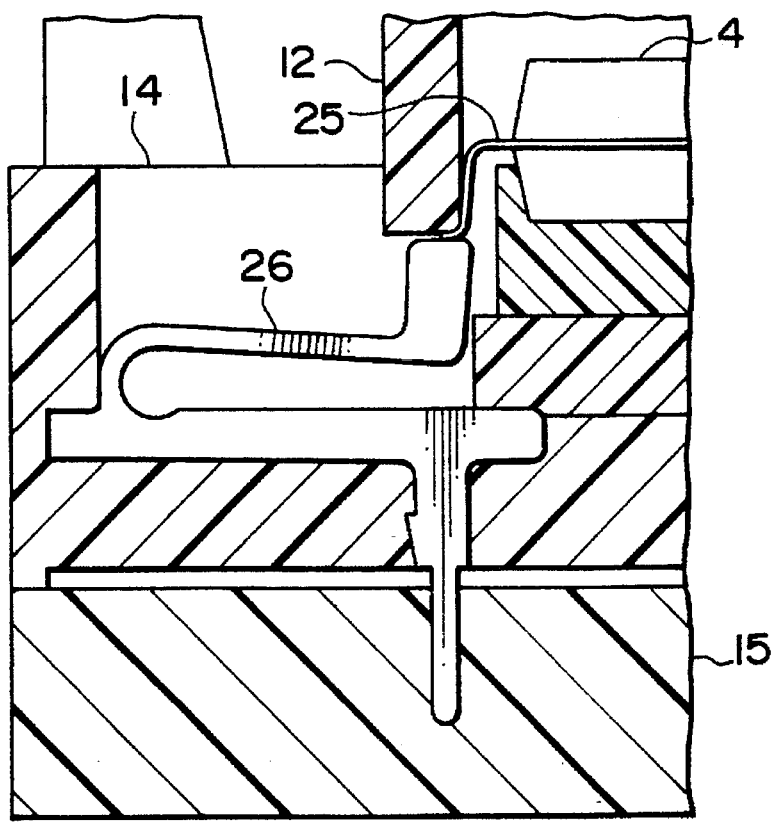

In both Embodiments 1 and 2, a single performance board 37 may be provided with a plurality of combinations of probe card 35 and extension board 36 to allow a plurality of ICs to be simultaneously measured. In this case, each probe card 35 is electrically connected to the performance board 37 through the corresponding extension board 36. Shown in FIG. 10 is a high production capacity probe-type test handler which is constructed by arranging a plurality of holder mechanisms 32 and pressure mechanisms 33 in the same layout pitch as in the probe cards. This type handler allows a plurality of identical electrical characteristic tests to be concurrently conducted on a plurality of ICs. This test handler can be used with the embodiment of FIG. 1A.

According to the first aspect and the eleventh aspect of the present invention, the probe card is used to allow the tip of the linear portion of the probe needle to be pressed into contact with the lead near its portion in the vicinity of the IC package edge where mechanical strength of the lead is higher. The production of solder sticking and solder balls is restricted, and thus a poor contact between the probe needle and the lead and a shortcircuit between leads are prevented. The lead is free from deformation, and defects attributed to a deformed lead are thus prevented.

According to the second aspect and the twelfth aspect of the present invention, a series of operations including steps of moving the IC, pressing the probe needle into contact with the lead of the IC, and moving the IC again, are performed in a continuous manner by the pressure mechanism comprising the XYZ stage and the holder mechanism. Such an arrangement not only shortens the operation time required, but also achieves a simplified construction of the apparatus.

According to the third aspect and the thirteenth aspect of the present invention, the pressure mechanism is provided with the rotation control means so that the holder mechanism is rotated around each of the three axes of X, Y, and Z. This arrangement allows the probe needle to be pressed into contact with the lead in an assured manner and offers the capability to accommodate a narrower lead spacing requirement in multiple pin design.

According to the fourth aspect and the fourteenth aspect of the present invention, the rotation control means comprises the rotation control module that controls the rotation of the holder mechanism in response to the signals from the position sensors that sense the positions of the probe needle and the lead. Therefore, a contact between the lead and the probe needle is established in an assured manner.

According to the fifth aspect and the fifteenth aspect of the present invention, the linear portion of the probe needle is 2 mm to 3 mm long, the angle of its bent portion is 92° to 95°, and the length of its beam portion is 5.5 mm to 8 mm long. Such an arrangement achieves an excellent contact state with solder sticking substantially restricted.

According to the sixth aspect and the sixteenth aspect of the present invention, a separation mechanism is provided to detach the probe needle from the lead after a measurement. The production of solder projections is substantially controlled.

According to the seventh aspect and the seventeenth aspect of the present invention, a groove is formed on the separation mechanism and the probe needle is received by the groove. This arrangement prevents the probe needle from slipping toward neighboring leads.

According to the eighth aspect and the eighteeenth aspect of the present invention, the small-magnitude vibrator means is provided to allow the separation mechanism to vibrate in a small magnitude. When the probe needle is put into contact with the lead of the IC, such vibration motion destroys an oxide layer formed on the lead solder coating on the bottom face of the lead and assures electrical contact between the probe needle and the lead.

According to the ninth aspect and the nineteenth aspect of the present invention, the separation mechanism comprises a miniature motor and a lead screw for driving the separation mechanism. Therefore, the probe needle is detached from the lead in an accurate manner.

According to the tenth aspect and the twentieth aspect of the present invention, a single performance board is provided with a plurality of probe cards and with the same number of pressure mechanisms as the probe cards. Such an arrangement allows a plurality of ICs to be simultaneously measured, and expands production capacity.

According to the twenty-first through the twenty-third aspect of the present invention, a judgment of whether or not each IC has been tested is easily made by looking into the bottom side of the IC. Since the dot mark on the lead remains invisible when the IC is mounted onto a printed circuit board or the like, aesthetics of the IC is not deteriorated.

What is claimed is:

1. A probe-type test handler comprising:
   a measurement module accommodating an electrical circuit for the measurement of electrical characteristics of an IC;
   a performance board electrically connected to the electrical circuit in an interchangeable manner that allows the type of the performance board to be selected according to the type of the IC to be measured;
   a probe card provided with a probe needle that is formed of a linear portion, a bent portion and a beam portion that continues from the bent portion; and
   a pressure mechanism that allows the tip of the linear portion of the probe needle to be pressed into contact with the lead projected out of an IC package near its IC package body.

2. The probe-type test handler according to claim 1, wherein said pressure mechanism comprises a holder mechanism for holding the IC, and an XYZ stage for moving the pressure mechanism in X, Y, and Z directions.

3. The probe-type test handler according to claim 2, wherein said pressure mechanism comprises rotation control means for rotating the holder mechanism around each of the three axes of X, Y, and Z in a controlled manner.

4. The probe-type test handler according to claim 3, wherein said rotation control means comprises a rotation control module that performs rotation control in response to signals from position sensors that sense the positions of the probe needle and the lead.

5. The probe-type test handler according to claim 1, wherein the linear portion is 2 mm to 3 mm long, the angle of the bent portion is 92° to 95°, and the length of the beam portion is 5.5 mm to 8 mm long.

6. The probe-type test handler according to claim 1, wherein a separation mechanism is provided to detach the probe needle from the lead by applying pressure to the probe needle after the measurement with the probe needle kept pressed into contact with the lead is completed.

7. The probe-type test handler according to claim 6, wherein a groove is formed on a pressure portion of the separation mechanism which applies pressure to the probe needle, and the probe needle is received by the groove.

8. The probe-type test handler according to claim 6, wherein small-magnitude vibrator means is provided to allow the separation mechanism to vibrate in a small magnitude.

9. The probe-type test handler according to claim 6, wherein the separation mechanism comprises a miniature motor and a lead screw for driving the separation mechanism.

10. The probe-type test handler according to claim 1, wherein a single performance board is provided with a plurality of probe cards and with the same number of pressure mechanisms as the probe cards.

11. A test handler for testing an IC package comprising:
    a plurality of electrically conducting probes;
    a measurement device electrically connected to the probes for measuring an electrical characteristic of an IC package;
    a holding mechanism for holding an IC package with leads of the IC package contacting the probes; and
    an electrically insulating pusher opposing the probes and movable with respect to the holding mechanism to push the probes away from the holding mechanism.

12. A test handler as claimed in claim 11 wherein the pusher is movably supported by the holding mechanism.

13. A test handler as claimed in claim 11 including a drive mechanism drivingly connected to the pusher for driving the pusher against the probes to move the probes away from the holding mechanism.

14. A test handler as claimed in claim 11 wherein the pusher includes a frame having a surface opposing the probes for simultaneously contacting all the probes.

15. A test handler as claimed in claim 14 wherein a plurality of grooves are formed in the surface of the frame for receiving the probes.

16. A test handler as claimed in claim 14 wherein the pusher includes a vibrator for imparting vibrations to the frame.

17. A test handler for testing an IC package comprising:
    a probe card comprising a plate and a plurality of electrically conducting probes mounted on the plate, each probe having an L-shaped region having a first portion extending substantially parallel to the plate and a second portion extending away from the plate and substantially perpendicular to the first portion, the second portion having a tapered end for contacting a lead of an IC package;

a measurement device electrically connected to the probes for measuring an electrical characteristic of an IC package; and a holding mechanism for holding an IC package with leads of the IC package contacting the probes.

18. A test handler as claimed in claim 17 wherein the probe card includes a wall extending from the plate, and the first portion of each L-shaped region is mounted on the wall.

19. A test handler as claimed in claim 17 wherein an angle between the first and second portions of the L-shaped region is 92 to 95 degrees.

20. A test handler as claimed in claim 17 wherein the probes are located with respect to the holding mechanism so as to contact the leads of an IC package held by the holding mechanism closer to a body of the IC package than to outer ends of the leads.

* * * * *